US012768909B2

(12) United States Patent
Butters

(10) Patent No.: US 12,768,909 B2
(45) Date of Patent: Oct. 20, 2026

(54) SYSTEMS AND METHODS FOR MEASURING MAGNETIC FIELDS AND IDENTIFYING PATTERNS IN THE MEASUREMENTS

(71) Applicant: NearField Atomics Inc., Seattle, WA (US)

(72) Inventor: John T. Butters, Seattle, WA (US)

(73) Assignee: NearField Atomics Inc., Seattle, WA (US)

( * ) Notice: Subject to any disclaimer, the term of this patent is extended or adjusted under 35 U.S.C. 154(b) by 62 days.

(21) Appl. No.: 18/707,845

(22) PCT Filed: Dec. 28, 2022

(86) PCT No.: PCT/US2022/054152
§ 371 (c)(1),
(2) Date: May 6, 2024

(87) PCT Pub. No.: WO2023/129590
PCT Pub. Date: Jul. 6, 2023

(65) Prior Publication Data

US 2025/0020737 A1 Jan. 16, 2025

Related U.S. Application Data

(60) Provisional application No. 63/295,398, filed on Dec. 30, 2021.

(51) Int. Cl.
*G01V 3/00* (2006.01)
*G01R 33/00* (2006.01)
(Continued)

(52) U.S. Cl.
CPC ..... *G01R 33/0023* (2013.01); *G01R 33/0094* (2013.01); *G01R 33/032* (2013.01); *G01R 33/0354* (2013.01); *G01R 33/09* (2013.01)

(58) Field of Classification Search
CPC .............. G01R 33/005; G01R 33/0023; G01R 33/032; G01R 33/0354; G01R 33/0094; G01R 33/09
See application file for complete search history.

(56) References Cited

U.S. PATENT DOCUMENTS

| | | |
|---|---|---|
| 6,541,978 B1 | 4/2003 | Benveniste et al. |
| 6,724,188 B2 | 4/2004 | Butters et al. |

(Continued)

FOREIGN PATENT DOCUMENTS

| | | |
|---|---|---|
| DE | 102014218744 | 3/2016 |
| EP | 2109771 B1 | 6/2010 |

(Continued)

OTHER PUBLICATIONS

Issadore D, Park YI, Shao H, Min C, Lee K, Liong M, Weissleder R, Lee H. Magnetic sensing technology for molecular analyses. Lab Chip. Jul. 21, 2014; 14(14):2385-97. doi: 10.1039/c4lc00314d.

(Continued)

*Primary Examiner* — Thang X Le
(74) *Attorney, Agent, or Firm* — Branch Partners PLLC; Bruce E. Black

(57) ABSTRACT

A method for identifying patterns and associated functions or structural features in molecules includes measuring an electromagnetic field of a target molecule in at least two dimensions using an array of magnetic field sensor devices; identifying at least one pattern in the measured electromagnetic fields of the target molecule and the other molecules; and associating the at least one pattern with at least one function or structural feature of the target molecule.

20 Claims, 6 Drawing Sheets

(51) Int. Cl.
*G01R 33/032* (2006.01)
*G01R 33/035* (2006.01)
*G01R 33/09* (2006.01)

(56) References Cited

U.S. PATENT DOCUMENTS

| | | | | |
|---|---|---|---|---|
| 6,952,652 | B2 | 10/2005 | Butters | |
| 6,995,558 | B2 | 2/2006 | Butters et al. | |
| 7,048,890 | B2 | 5/2006 | Coehoorn et al. | |
| 7,081,747 | B2 | 7/2006 | Butters et al. | |
| 7,412,340 | B2 | 8/2008 | Butters | |
| 8,456,157 | B2 | 6/2013 | Litvinov et al. | |
| 8,494,198 | B2 | 7/2013 | Aldaz et al. | |
| 8,838,022 | B2 | 9/2014 | Dobyns | |
| 8,929,809 | B2 | 1/2015 | Dobyns | |
| 9,300,367 | B2 | 3/2016 | Christensen et al. | |
| 9,417,257 | B2 | 8/2016 | Butters et al. | |
| 9,455,771 | B2 | 9/2016 | Dobyns | |
| 9,742,471 | B1 | 8/2017 | Thoen | |
| 10,012,706 | B2 | 7/2018 | Bates et al. | |
| 10,015,623 | B2 | 7/2018 | Thoen | |
| 10,046,172 | B2 | 8/2018 | Butters et al. | |
| 10,210,409 | B1 | 2/2019 | Migneco et al. | |
| 10,715,937 | B2 | 7/2020 | Haubrich et al. | |
| 10,939,488 | B2 | 3/2021 | Ng et al. | |
| 11,103,721 | B2 | 8/2021 | Butters et al. | |
| 2002/0077537 | A1* | 6/2002 | Avrin | G01V 3/08 600/408 |
| 2004/0233060 | A1 | 11/2004 | Mohri | |
| 2005/0087000 | A1 | 4/2005 | Coehoorn et al. | |
| 2007/0042506 | A1* | 2/2007 | Bangert | G01N 33/585 436/524 |
| 2007/0148670 | A1 | 6/2007 | O'Malley | |
| 2008/0097142 | A1 | 4/2008 | Savage | |
| 2010/0049078 | A1* | 2/2010 | Faupel | A61B 5/242 600/547 |
| 2010/0097186 | A1 | 4/2010 | Wielebski et al. | |
| 2010/0188075 | A1* | 7/2010 | Litvinov | G01N 33/54373 252/62.51 R |
| 2010/0264917 | A1 | 10/2010 | Budker et al. | |
| 2010/0298624 | A1 | 11/2010 | Becker | |
| 2011/0148640 | A1 | 6/2011 | Kang et al. | |
| 2011/0244599 | A1 | 10/2011 | Whig et al. | |
| 2012/0136585 | A1 | 5/2012 | Apostolos et al. | |
| 2012/0310550 | A1 | 12/2012 | Bates et al. | |
| 2013/0261374 | A1 | 10/2013 | Elder | |
| 2013/0324786 | A1 | 12/2013 | Rogachefsky | |
| 2014/0029777 | A1 | 1/2014 | Jang | |
| 2014/0292318 | A1 | 10/2014 | Wang et al. | |
| 2015/0097553 | A1* | 4/2015 | Kranck | G06F 17/18 324/204 |
| 2015/0335288 | A1 | 11/2015 | Toth et al. | |
| 2015/0355189 | A1* | 12/2015 | Oman | B01D 15/08 506/2 |
| 2016/0008632 | A1 | 1/2016 | Wetmore et al. | |
| 2016/0011183 | A1 | 1/2016 | Egan et al. | |
| 2016/0028493 | A1 | 1/2016 | Ohishi et al. | |
| 2016/0030761 | A1 | 2/2016 | Butters et al. | |
| 2017/0067969 | A1 | 3/2017 | Butters et al. | |
| 2017/0097337 | A1 | 4/2017 | Schultz et al. | |
| 2017/0117972 | A1 | 4/2017 | Ishibashi | |
| 2017/0164834 | A1 | 6/2017 | Park et al. | |
| 2017/0207860 | A1 | 7/2017 | Zhang | |
| 2017/0244496 | A1 | 8/2017 | Geurts et al. | |
| 2017/0266443 | A1 | 9/2017 | Rajguru et al. | |
| 2017/0343695 | A1* | 11/2017 | Stetson | G01V 3/101 |
| 2018/0237850 | A1 | 8/2018 | Mandell et al. | |
| 2018/0353095 | A1 | 12/2018 | Boesen | |
| 2019/0015048 | A1 | 1/2019 | Baker et al. | |
| 2019/0143135 | A1 | 5/2019 | Butters | |
| 2019/0184188 | A1 | 6/2019 | Butters et al. | |
| 2019/0317167 | A1 | 10/2019 | Laborde et al. | |
| 2020/0295848 | A1 | 9/2020 | Kong et al. | |
| 2020/0326309 | A1 | 10/2020 | Braganca et al. | |
| 2021/0204867 | A1 | 7/2021 | Toth et al. | |
| 2022/0226663 | A1 | 7/2022 | Butters et al. | |
| 2022/0257962 | A1 | 8/2022 | Mogen et al. | |
| 2022/0274604 | A1 | 9/2022 | Butters et al. | |
| 2022/0296912 | A1 | 9/2022 | Butters et al. | |
| 2023/0201615 | A1 | 6/2023 | Figueroa et al. | |
| 2023/0240529 | A1 | 8/2023 | Toth et al. | |
| 2024/0189612 | A1 | 6/2024 | Butters | |

FOREIGN PATENT DOCUMENTS

| | | | |
|---|---|---|---|
| EP | 2115468 | B1 | 6/2010 |
| EP | 1566651 | B1 | 6/2013 |
| EP | 2614770 | | 7/2013 |
| EP | 2800970 | B1 | 9/2016 |
| EP | 3695878 | | 8/2020 |
| EP | 3747506 | A1 | 12/2020 |
| WO | 2014/184395 | A9 | 11/2014 |
| WO | 2019/070911 | | 4/2019 |
| WO | 2019/140404 | | 7/2019 |
| WO | 2019/142196 | | 7/2019 |

OTHER PUBLICATIONS

Oogane, M., Fujiwara, K., Kanno, A., Nakano, T., Wagatsuma, H., Arimoto, T., Mizukami, S., Kumagai, S., Matsuzaki, H., Nakasato, N., & Ando, Y. (2021). Sub-pT magnetic field detection by tunnel magneto-resistive sensors. Applied Physics Express, 14(12), [123002]. https://doi.org/10.35848/1882-0786/ac3809.

Richard S. Gaster; Giant Magnetoresistive Nanosensors for Ultrasensitive In Vitro Diagnostics and Biomolecular Kinetics. Dissertation submitted to Stanford University, Nov. 2011; 163 pages. Available on-line at https://purl.stanford.edu/jt093nq0893.

Adem S, Jain S, Sveiven M, Zhou X, O'Donoghue AJ, Hall DA. Giant magnetoresistive biosensors for real-time quantitative detection of protease activity. Sci Rep. May 14, 2020;10(1):7941. doi: 10.1038/s41598-020-62910-2. PMID: 32409675; PMCID: PMC7224196.

Wang, W., Wang, Y., Tu, L et al. Magnetoresistive performance and comparison of supermagnetic nanoparticles on giant magnetoresistive sensor-based detection system. Sci Rep 4, 5716 (2014). https://doi.org/10.1038/srep05716.

Rizzi, G., Dufva, M. & Hansen, M. Magnetoresistive sensors for measurements of DNA hybridization kinetics—effect of TINA modifications. Sci Rep 7, 41940 (2017). https://doi.org/10.1038/srep41940.

Trisnanto, Suko & Kasajima, Tamon & Akushichi, Taiju & Takemura, Yasushi. (2021). Magnetic particle imaging using linear magnetization response-driven harmonic signal of magnetoresistive sensor. Applied Physics Express. 14. 10.35848/1882-0786/ac1d63.

Ioanna Giouroudi and Evangelos Hristoforou , "Perspective: Magnetoresistive sensors for biomedicine", Journal of Applied Physics 124, 030902 (2018) https://doi.org/10.1063/1.5027035.

Baselt DR, Lee GU, Natesan M, Metzger SW, Sheehan PE, Colton RJ. A biosensor based on magnetoresistance technology. Biosens Bioelectron. Oct. 1, 1998; 13(7-8):731-9. doi: 10.1016/s0956-5663(98)00037-2. PMID: 9828367.

Yao, Li & Xu, Shoujun. (2014). Detection of magnetic nanomaterials in molecular imaging and diagnosis applications. Nanotechnology Reviews. 3. 247-268. 10.1515/ntrev-2013-0044.

Yin, T.-I & Paul, J. & Lehndorff, Ronald. (2016). 3.3.1—Magnetoresistive Sensors for the Application in Biotechnology. 190-194. 10.5162/sensoren2016/3.3.1.

Shirai Y, Hirao K, Shibuya T, Okawa S, Hasegawa Y, Adachi Y, Sekihara K, Kawabata S. Magnetocardiography Using a Magnetoresistive Sensor Array. Int Heart J. Jan. 25, 2019;60(1):50-54. doi: 10.1536/ihj.18-002. Epub Nov. 2., 2018. PMID: 30464123.

Smith, C.H., & Schneider, R.W. (2000). GMR and SDT Sensors and Arrays for LowField Magnetic Applications. Nonvolatile Electronics, Inc. 12 pages.

Bae, Seongtae. (2010). In-Vitro Magnetoresistive Biosensors for Single Molecular Based Disease Diagnostics: Optimization of Sensor Geometry and Structure. 10.5772/6870.

(56) References Cited

OTHER PUBLICATIONS

Henriksen, Anders & Ley, Mikkel & Flyvbjerg, Henrik & Hansen, Mikkel. (2015). Configurational Statistics of Magnetic Bead Detection with Magnetoresistive Sensors. PloS one. 10. e0141115. 10.1371/journal.pone.0141115.
Reiss, Guenter & Brückl, Hubert & Hutten, Andreas & Schotter, Joerg & Brzeska, Monika & Panhorst, Michael & Sudfeld, Daniela & Becker, Anke & Kamp, Paul-Bertram & Puehler, Alfred & Wojczykowski, Klaus & Jutzi, Peter. (2004). Magnetoresistive Sensors and Magnetic Nanoparticles for Biotechnology. Journal of Materials Research. 20. 3294-3302. 10.1557/PROC-853-I9.1.
Su D, Wu K, Saha R, Peng C, Wang JP. Advances in Magnetoresistive Biosensors. Micromachines (Basel). Dec. 26, 2019;11(1):34. doi: 10.3390/mi11010034. PMID: 31888076; PMCID: PMC7019276.
Ulasov IV, Foster H, Butters M, Yoon JG, Ozawa T, Nicolaides T, Figueroa X, Hothi P, Prados M, Butters J, Cobbs C. Precision knockdown of EGFR gene expression using radio frequency electromagnetic energy. J Neurooncol. Jun. 2017;133(2):257-264. doi: 10.1007/s11060-017-2440-x. Epub Apr. 22, 2017. PMID: 28434113.
Butters, John & Figueroa, Xavier & Butters, Bennett. (2014). Non-Thermal Radio Frequency Stimulation of Tubulin Polymerization in Vitro: A Potential Therapy for Cancer Treatment. Open Journal of Biophysics. 04. 147. 10.4236/ojbiphy.2014.44015.
Mukthavaram R, Jiang P, Nomura N, et al. ATPS-64: Preclinical Studies Using Nativis Voyager RFE System, a Novel Non-Invasive, Low Energy, Non-Thermal, Non-Ionizing Radiofrequency Energy (RFE) Device in Glioblastoma Mouse Models. Neuro Oncol. 2015; 17(Suppl 5):v32. doi: 10.1093/neuonc/nov204.64.
Cobbs C, McClay E, Duic JP, Nabors LB, Morgan Murray D, Kesari S. An early feasibility study of the Nativis Voyager® device in patients with recurrent glioblastoma: first cohort in US. CNS Oncol. Mar. 2019;8(1): CNS30. doi: 10.2217/cns-2018-0013. Epub Dec. 14, 2018. PMID: 30547676; PMCID: PMC6499016.
Murphy M, Dowling A, Thien C, Priest E, Morgan Murray D, Kesari S. A feasibility study of the Nativis Voyager® device in patients with recurrent glioblastoma in Australia. CNS Oncol. Mar. 2019;8(1):CNS31. doi: 10.2217/cns-2018-0017. Epub Feb. 7, 2019. PMID: 30727742; PMCID: PMC6499017.
Ulasov, Ilya & Ghosh, Dhimankrishna & Butters, Mike & Butters, John & Cobbs, Charles. (2016). EXTH-50. Specific Knockdown of EGFR and PLK1 Gene Expression in U87 GBM Cells With Radiofrequency Energy (RFE) Device. Japan Society for Neuro-Oncology. 18. vi70-vi70. 10.1093/neuonc/now212.292.
Butters, Bennett & Vogeli, Gabriel & Figueroa, Xavier. (2017). Non-Thermal Radio Frequency Stimulation Inhibits the Tryptophan Synthase Beta Subunit in the Algae Chlamydomonas reinhardtii. Open Journal of Biophysics. 07. 82-93. 10.4236/ojbiphy.2017.73007.
Figueroa, Xavier; Green, Yesenia; Murray, Donna Morgan; and Butters, Mike. Effects of Magnetic Fields on Biological Systems, An Overview. EMulate Therapeutics, Mar. 6, 2020. 8 pages.
Figueroa, Xavier & Butters, Mike & Donnell, Scott. (2019). SCIDOT-47. Effect of uIRFE Cognates Emulating Bioactive Substances on Animal Behavior. Neuro-Oncology. 21. vi281-vi282. 10.1093/neuonc/noz175.1183.
"Stimulant," Wikipedia, The Free Encyclopedia, https://en.wikipedia.org/wiki/stimulant (accessed Feb. 23, 2024) (Year: 2024).
Press Release for "Hapbee Announces Filing of Provisional Patent Application for Bed-Related Form Factor," Feb. 19, 2021, found at https://hapbee.com/blogs/hapbee/hapbee-announces-filing-of-provisional-patent-application-for-bed-related-form-factor.
Andrew Kelly, "Integrated Circuit Design for Miniature Implantable Medical Devices," Presented at the Embedded Systems Conference at Design East in Boston, MA. Sep. 18, 2012. 14 pages.
"Theobromine," Wikipedia, The Free Encyclopedia, https://en.wikipedia.org/wiki/theobromine (accessed Feb. 23, 2024) (Year: 2024).
International Search Report and Written Opinion for PCT Application No. PCT/US2022/054152 mailed Apr. 13, 2023.
Written Opinion of the International Preliminary Examining Authority for PCT Application No. PCT/US2022/054152 mailed Mar. 14, 2024.
International Preliminary Report on Patentability for PCT Application No. PCT/US2022/054152 mailed Jun. 12, 2024.
Kim, Han-Joon, et al. "Review of near-field wireless power and communication for biomedical applications." IEEE Access, vol. 5, 2017, pp. 21264-21285, https://doi.org/10.1109/access.2017.2757267. (Year: 2017).

* cited by examiner

SYSTEMS AND METHODS FOR MEASURING MAGNETIC FIELDS AND IDENTIFYING PATTERNS IN THE MEASUREMENTS

CROSS-REFERENCE TO RELATED APPLICATIONS

This patent application claims priority to U.S. Provisional Application Ser. No. 63/295,398, filed Dec. 30, 2021, which is incorporated herein by reference.

FIELD

The present invention is directed to the area of systems and methods for measuring magnetic fields. The present invention is also directed to systems and methods for measuring magnetic fields and identifying patterns in the measurements.

BACKGROUND

Ultra-low radio frequency energy therapy is based on measurement of the unique electrostatic potential of a target molecule. The unique and specific ultra-low radio frequency energy is used to induce electron and charge transfer in a defined bioactive target, altering cell dynamics to produce a therapeutic response. In at least some embodiments, to provide therapy, an ultra-low radio frequency energy cognate of a target molecule is delivered locally and non-systemically via a medical device. To provide the therapy, the ultra-low radio frequency energy cognate must be obtained.

BRIEF SUMMARY

One embodiment is a method for identifying patterns and associated functions or structural features in molecules. The method includes measuring an electromagnetic field of a target molecule in at least two dimensions using an array of magnetic field sensor devices; identifying at least one pattern in the measured electromagnetic fields of the target molecule and the other molecules; and associating the at least one pattern with at least one function or structural feature of the target molecule.

In at least some embodiments, the method further includes comparing the measured electromagnetic field of the target molecule with measured electromagnetic fields of other molecules to identify at least one common pattern in the measured electromagnetic fields of the target molecule and the other molecules; and associating the at least one common pattern with at least one common function or structural feature of the target molecule and the other molecules.

In at least some embodiments, mapping the electromagnetic field includes mapping an electromagnetic field of a target molecule in three dimensions. In at least some embodiments, the electromagnetic field includes mapping an electromagnetic field of a target molecule in at least two different planes.

In at least some embodiments, the magnetic field sensor devices are magnetoresistive (MR) sensor devices. In at least some embodiments, the magnetic field sensor devices are superconducting quantum interference devices (SQUIDs). In at least some embodiments, the magnetic field sensor devices are optically pumped magnetometer (OPM) sensor devices.

In at least some embodiments, the identifying includes identifying at least one statistical pattern in the measured electromagnetic field of the target molecule as the at least one pattern. In at least some embodiments, the associating includes associating the at least one statistical pattern to a sequence, structural feature, or function of the target molecule.

In at least some embodiments, measuring the electromagnetic field of the target molecule includes solvating the target molecule in a solvent; placing the solvated target molecule in a sensor arrangement including the array of magnetic field sensor devices; subjecting the solvated target molecule to a stimulus; and acquiring a magnetic field generated by the solvated target molecule in response to the stimulus.

Another embodiment is a system that includes a sensor array configured for measuring or mapping an electromagnetic field generated by a target molecule; a processing and storage arrangement configured for processing the electromagnetic field and storing the electromagnetic field after processing as a processed electromagnetic field; and a pattern recognition module configured for identifying any patterns in the processed electromagnetic field.

In at least some embodiments, the pattern recognition module is configured for identifying at least one statistical pattern in the processed electromagnetic field of the target molecule. In at least some embodiments, the pattern recognition module is further configured for associating the at least one statistical pattern to a sequence, structural feature, or function of the target molecule.

In at least some embodiments, the pattern recognition module is configured for comparing the processed electromagnetic field of the target molecule with measured electromagnetic fields of other molecules to identify at least one common pattern in the processed electromagnetic fields of the target molecule and the other molecules and associating the at least one common pattern with at least one common function or structural feature of the target molecule and the other molecules. In at least some embodiments, the system further includes at least one machine learning module for assisting the pattern recognition module to identify the at least one common pattern.

In at least some embodiments, the sensor array is configured for measuring or mapping the electromagnetic field of the target molecule in three dimensions. In at least some embodiments, the sensor array is configured for measuring or mapping the electromagnetic field of the target molecule in at least two different planes.

In at least some embodiments, the sensor array includes a plurality of magnetoresistive (MR) sensor devices. In at least some embodiments, the sensor array includes a plurality of superconducting quantum interference devices (SQUIDs). In at least some embodiments, the sensor array includes a plurality of optically pumped magnetometer (OPM) sensor devices.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description, which is to be read in association with the accompanying drawings, wherein.

DETAILED DESCRIPTION

Figure 1:
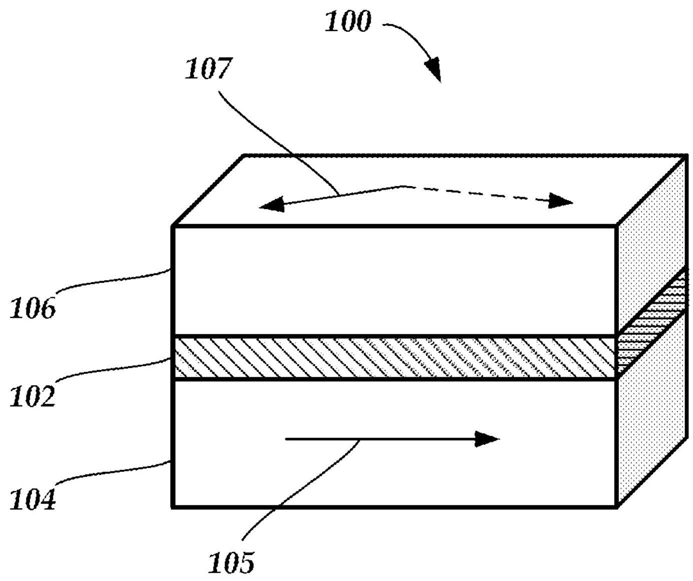
FIG. 1 is a diagram of one embodiment of a magnetoresistive (MR) sensor.

The present invention is directed to the area of systems and methods for measuring magnetic fields. The present invention is also directed to systems and methods for measuring magnetic fields and identifying patterns in the measurements.

Ultra-low radio frequency energy therapy is based on measurement of the unique electrostatic potential of a target molecule. Every molecule has a unique electrostatic surface potential. This potential influences how a molecule interacts with proteins and other biological agents. Electron and charge transfer are central to many biological processes and are a direct result of interacting surface potentials. Artificial magnetic fields are capable of triggering a similar receptor response and conformational change in the absence of a physical drug or molecular agonist.

The unique and specific ultra-low radio frequency energy is used to induce electron and charge transfer in a defined bioactive target, altering cell dynamics to produce a therapeutic response. In at least some embodiments, to provide therapy, an ultra-low radio frequency energy cognate of a target molecule is delivered locally and non-systemically via a medical device. Pre-clinical and clinical studies suggest that ultra-low radio frequency energy therapy provides the ability to specifically regulate metabolic pathways and replicate known mechanisms of action for proven commercial drugs.

Examples of therapy delivery using ultra-low radio frequency energy can be found in U.S. Pat. Nos. 6,724,188; 6,952,652; 6,995,558; 7,081,747; 7,412,340; 10,046,172; 9,417,257; and 11,103,721; U.S. Patent Application Publications Nos. 2019/0143135 and 2019/0184188; and PCT Patent Application Publication WO 2019/070911, all of which are incorporated herein by reference in their entireties. In at least some embodiments, the delivery of ultra-low radio frequency energy includes the generation of a magnetic field having a field strength of up to 1 Gauss. In at least some embodiments, the delivery of ultra-low radio frequency energy includes the generation of a therapeutic magnetic signal having a frequency in the range of 0.1 Hz to 22 kHz or in the range of 1 Hz to 22 kHz.

Examples of affecting biologic activity with ultra-low radio frequency energy fields includes experiments conducted to demonstrate the specificity and cellular effects of a specific ultra-low radio frequency energy targeting epidermal growth factor receptor, EGFR, on glioblastoma cell line U-87 MG. At 48 and 72 hrs, EGFR inhibition by the ultra-low radio frequency energy reduced the level of EGFR protein by 27% and 73%, respectively. These data indicate that ultra-low radio frequency energy can inhibit gene expression at the transcriptional and protein levels, similar to what is observed with physical small interfering RNA (siRNA) inhibition. Specific EGFR knockdown effect was detected in U-87 MG cells treated with ultra-low radio frequency energy using an 80 gene PCR-based array. See, "Effects of Magnetic Fields on Biological Systems An Overview"; X. Figueroa, Y. Green, D. M. Murray, and M. Butters; EMulate Therapeutics; Mar. 6, 2020.

In another example, ultra-low radio frequency energy therapy was provided as a cancer treatment for over 400 dogs (pets) with naturally occurring malignancies. Interim review of the first 200 pets observed partial responses and complete responses in over 20 different tumor types. No clinically important or significant toxicities (Grade 3 or 4) were observed.

Conventionally, superconducting quantum interference devices (SQUID) have been used to measure the unique electrostatic potential of molecules. SQUIDs, however, can be bulky, expensive, and require cryogenic fluids for operation.

As described herein, a magnetoresistive (MR) sensor can be used in a single or multi-channel configuration to measure the magnetic field of a solvated target molecule and produce measurement signals. The measurement signals are processed and stored (for example, as a 24-bit WAV file) for uses such as, for example, therapy or drug discovery. In at least some embodiments, the bandwidth of the stored measurement signals is in a range from DC to 22 kHz or more. In at least some instances, particularly when using an MR sensor, the bandwidth is in a range of 0.1 Hz to 10 kHz.

FIG. 1 illustrates one embodiment of a magnetoresistive (MR) sensor 100 (which is also known as a tunnel magnetoresistive (TMR) sensor or magnetic tunnel junction (MTJ) sensor) that includes a thin film 102 of non-magnetic material between two ferromagnetic films that form a pin layer 104 and a free layer 106, respectively. The pin layer 104 has a direction of magnetization 105 that is pinned. Pinning can be accomplished by a variety of methods including forming the pin layer 104 of a material in a defined crystal structure. The direction of magnetization 107 of the free layer 106 follows the direction of an external magnetic field. For example, the free layer 106 can be formed of a material in an amorphous (e.g., non-crystalline) structure. Examples of MR devices are found in, for example, European Patent Application No. EP 2614770, incorporated herein by reference in its entirety.

The electrical resistance of the magnetoresistive sensor 100 varies (in at least some embodiments, proportionally) with a relative angle between the directions of magnetization in the pin layer 104 and the free layer 106. Thus, by observing the resistance of the magnetoresistive sensor 100, the direction of the external magnetic field can be determined.

Figure 2:
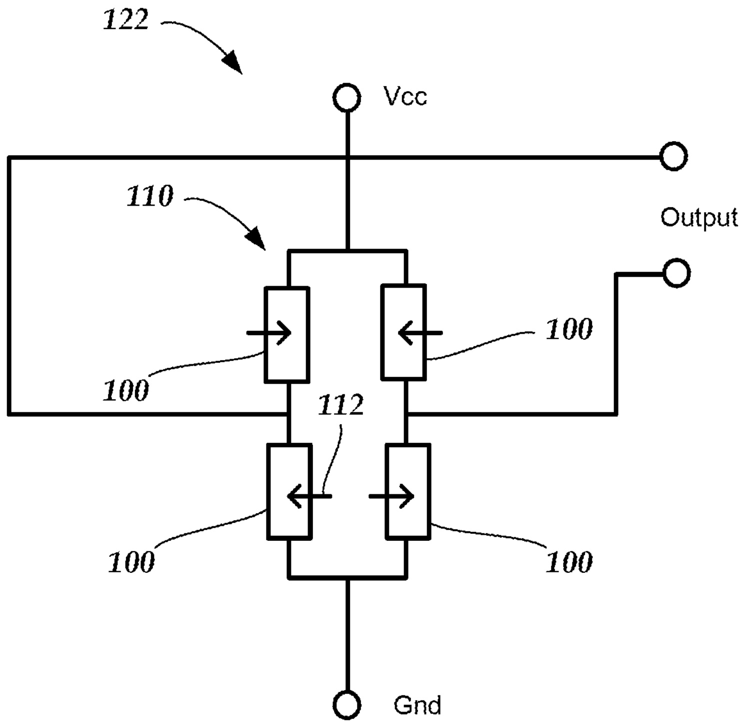
FIG. 2 illustrates one embodiment of an arrangement of MR sensors in a Wheatstone bridge for temperature compensation.

One or more MR sensors 100 can be used to measure the magnetic field by coupling to a DC power source. In FIG. 2, a MR sensor device 122 includes a Wheatstone bridge arrangement 110 of four MR sensors 100 (where the arrows 112 indicate the direction of magnetization of the pin layer 106) can be used for differential temperature compensation. One example of a MR sensor device that utilizes the MR sensors 100 is the TDK Nivio xMR Sensor (TDK Corporation, Tokyo, Japan).

Figure 3:
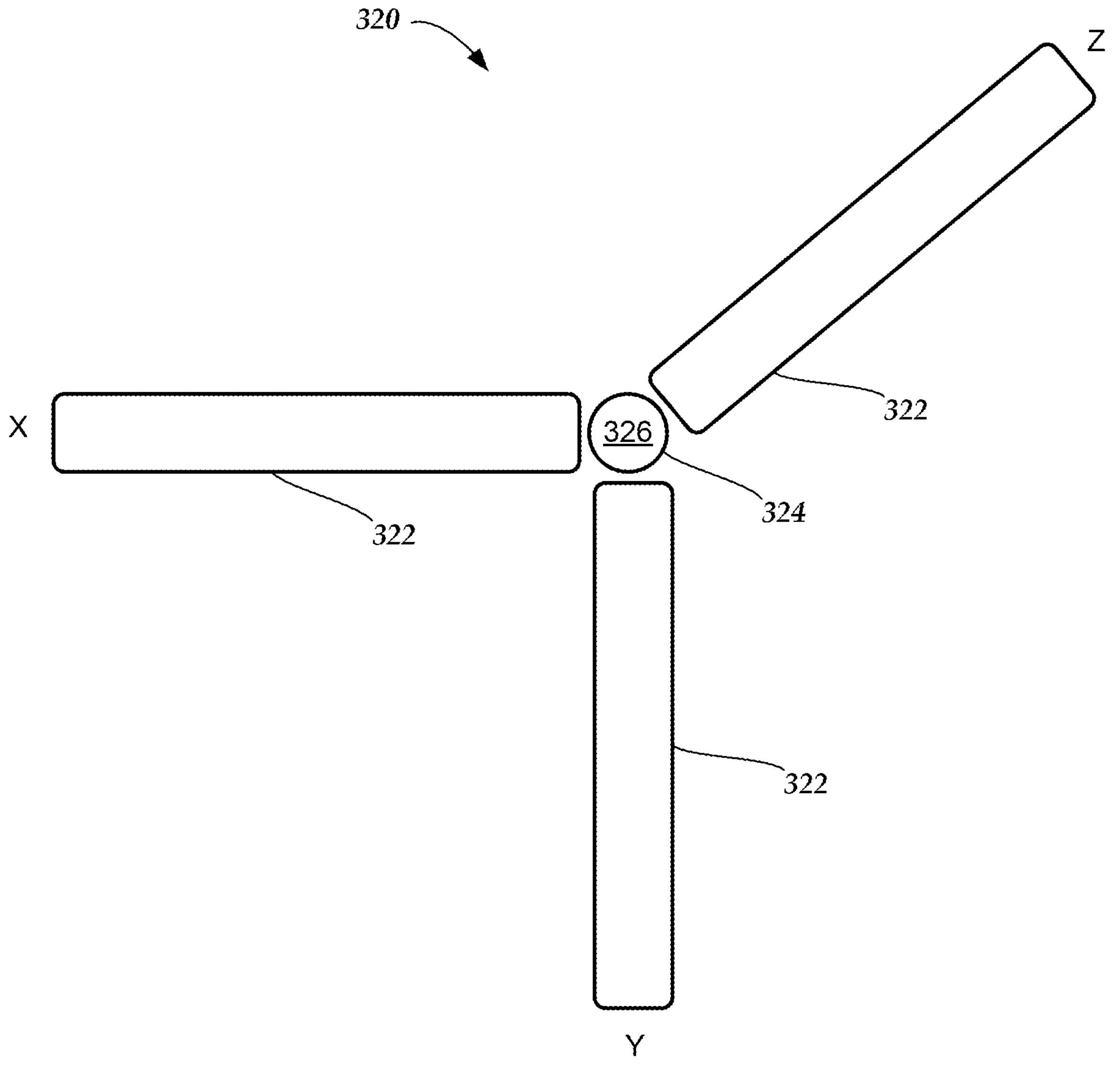
FIG. 3 is a schematic diagram of one embodiment of an arrangement of MR sensor devices around a container of solvated target molecule, according to the invention.

FIG. 3 illustrates one embodiment of a sensor arrangement 320 with multiple MR sensor devices 322 disposed around a container 324 with the target molecule 326 solvated in a solvent (for example, water, saline, phosphate buffered saline (PBS), plasma, or blood). The target molecule 326 can be any suitable target including, but not limited to, drug molecules (e.g., Taxol), oligonucleotides (e.g., RNA, mRNA, or the like), or any combination thereof.

In the illustrated embodiment, a MR sensor device 322 is positioned at the x, y, and z axes to measure the magnetic field arising from the electrostatic potential of the target molecule. Such measurement may include, for example, injecting noise into the sample in the container and recording the resulting magnetic field, as described in the references cited above. In at least some embodiments, the MR sensor device 322 can be a single MR sensor 100 or can be multiple MR sensors 100 arranged in the bridge illustrated in FIG. 2 or any other suitable arrangement.

Figure 4:
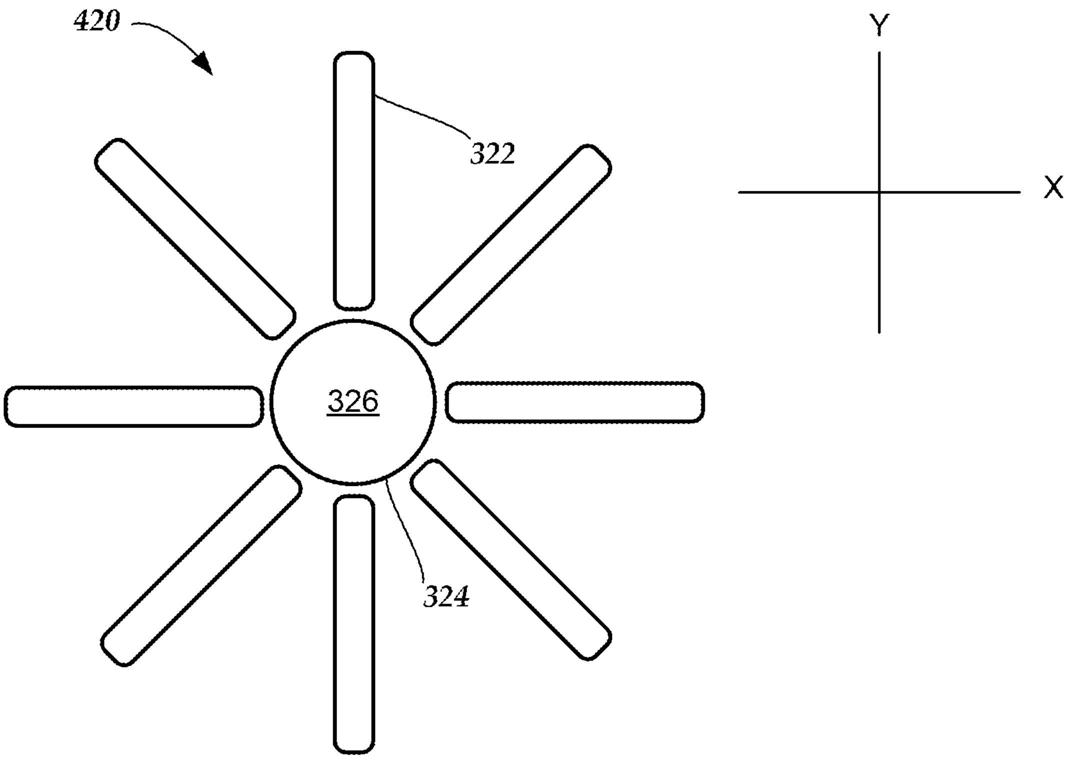
FIG. 4 is a schematic diagram of another embodiment of an arrangement of MR sensor devices around a container of solvated target molecule, according to the invention.

FIG. 4 illustrates another embodiment of a sensor arrangement 420 with multiple MR sensor devices 322 disposed around the container 324 with the solvated target molecule. In this particular arrangement, eight MR sensor devices 322 are arranged around in the container in the x-y plane.

Figure 5:
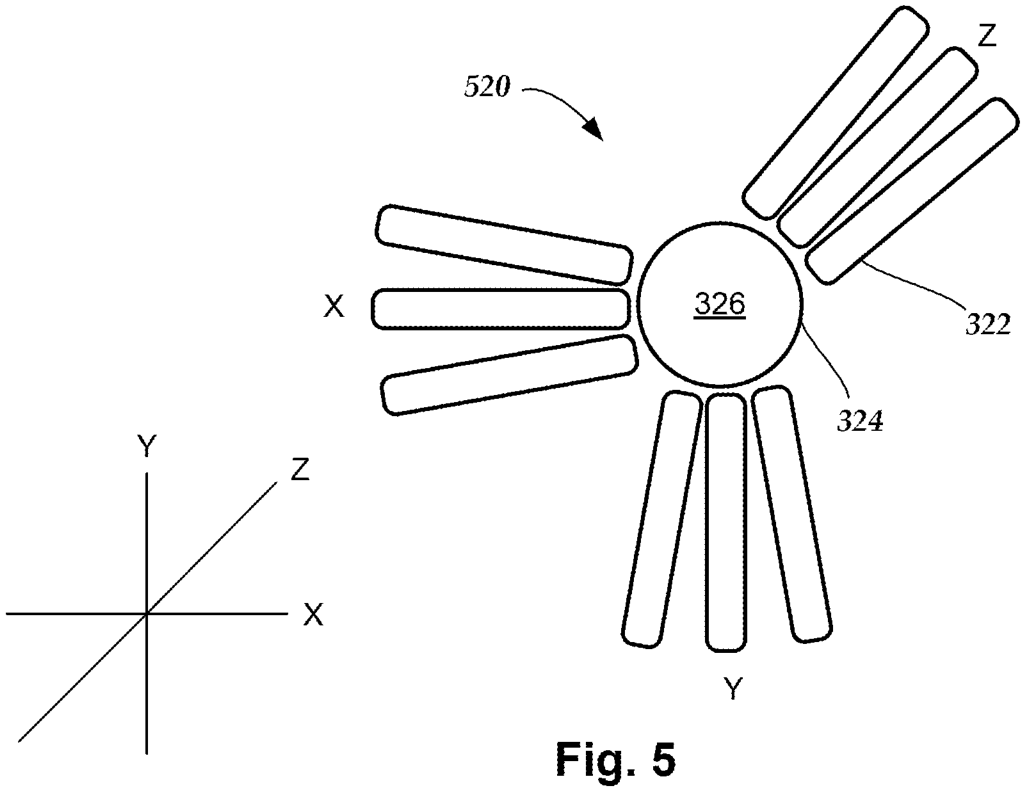
FIG. 5 is a schematic diagram of a third embodiment of an arrangement of MR sensor devices around a container of solvated target molecule, according to the invention.

FIG. 5 illustrates a further embodiment of a sensor arrangement 520 with multiple MR sensor devices 322 disposed around the container 324 with the solvated target molecule. In this particular arrangement, three MR sensor devices 322 are arranged around each of the x, y, and z axes. It will be recognized that other three-dimensional arrangements of MR sensor devices can be used including, for example, providing the arrangement illustrated in FIG. 4 along multiple planes (for example, the x-y plane and the y-z plane).

The arrangements of MR sensor devices 322 illustrated in FIGS. 3, 4, and 5 are examples of multi-channel configurations for recording the electrostatic potential of a target molecule. It will be understood that single channel configurations with a single MR sensor device (or multiple MR sensor devices positioned together) can also be used.

Figure 6:
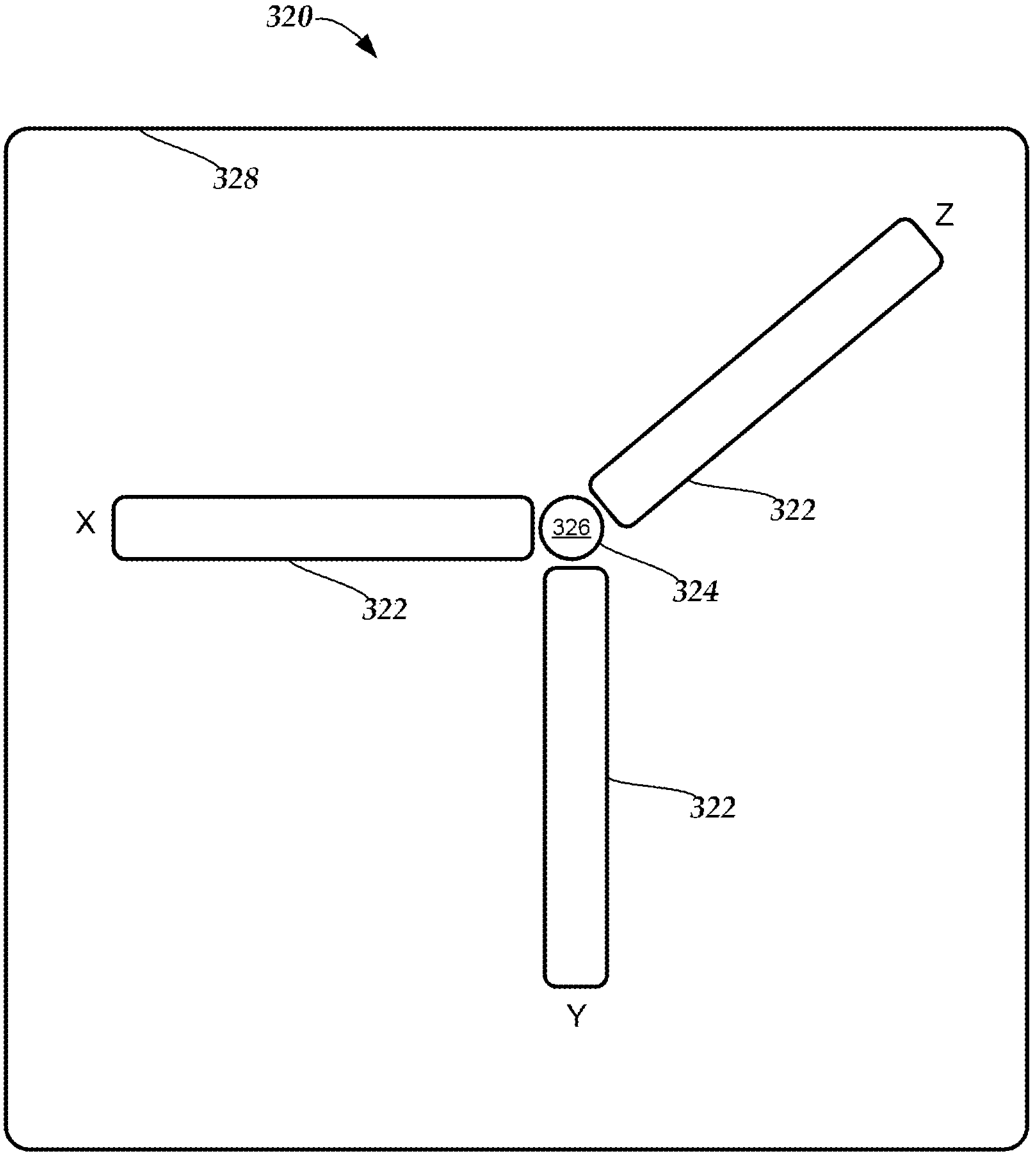
FIG. 6 is a schematic diagram of the arrangement of MR sensor devices around a container of solvated target molecule of FIG. 3 inside a shield, according to the invention.

FIG. 6 illustrates the sensor arrangement of 320 disposed within a shield 328 to reduce or remove the ambient magnetic field (such as the Earth's magnetic field) within the shield. The shield can be a passive shield (for example, made of mu-metal or other shielding material or a Faraday cage or the like) or an active shield (for example, one or more magnetic field generators to counter the ambient magnetic field) or any combination thereof.

Figure 7:
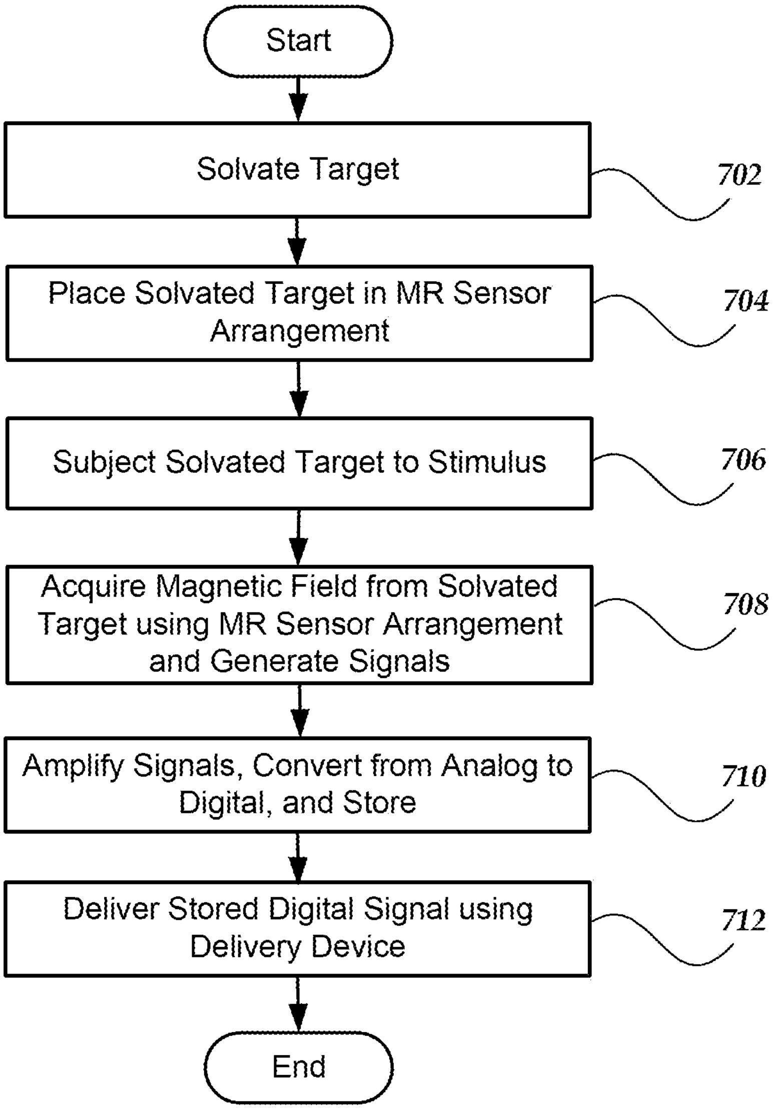
FIG. 7 is one embodiment of a workflow a workflow for generating and employing ultra-low radio frequency energy using MR sensor devices, according to the invention.

FIG. 7 illustrates one embodiment of a workflow for generating and employing ultra-low radio frequency energy using the MR sensor devices described herein. In step 702, the target molecule is solvated in a solvent, such as, for example, water, saline, PBS, plasma, or blood. In step 704, the solvated target is placed in a MR Sensor arrangement, such as one of those illustrated in FIG. 3, 4, or 5, or any other multi-channel or single channel configuration or arrangement.

In step 706, the solvated target is subjected to a stimulus (for example, noise or other suitable signal) to elicit a response. In step 708, the MR sensor devices of the MR sensor arrangement acquire the magnetic field generated by the solvated target and the MR sensor devices generate signals based on the acquired magnetic field. In step 710, the signals from the MR sensor devices are amplified or otherwise processed, converted from analog to digital signals, and stored.

In step 712, the stored digital signals are then provided to a delivery device, such as a therapy delivery device, to deliver the signals to a target and elicit the desired response based on the initial target molecule.

Electrostatic interactions of molecules are important to understanding the interaction of a drug with a biological system. Improvements in the determination of molecular force fields and improved visualization capabilities have enabled expansion beyond the ligand-only view of the electrostatics of drug interactions to include proteins, water, and ligands. Insights into the causes of ligand binding are now available to assist in drug discovery and design. Factors affecting molecular recognition of a drug include electrostatics, three-dimensional shape, and hydrophobicity. Creating accurate computational models for these factors for ligand and protein active sites can facilitate successful drug discovery and design.

Electromagnetic mapping can also facilitate an understanding of how a biomolecule's ELF-EM (extremely low frequency electromagnetic) micro-amplifications play a role in ligand-receptor interactions. In at least some embodiments, "extremely low frequency" refers to frequencies in a range from 3 to 30 Hz with a corresponding wavelength in a range of 10,000 to 100,000 km. In at least some embodiments, a micro-amplification is a weak amplification, modification, or variation of the molecule's weak magnetic field.

Improving electromagnetic mapping can facilitate new therapeutic drug development. As described above, the electromagnetic (e.g., the magnetic field) can be measured or mapped by injecting noise into a sample in a container and recording the resulting electromagnetic field using an array of magnetic field sensors such as, for example, MR sensors, SQUIDs, optically pumped magnetometers (OPMs), or the like or any combination thereof.

Biomolecular-drug interactions are formed when the valence electrons of complementary precursors (e.g., the biomolecule and drug) interact. In at least some instances, these interactions are initiated or maintained by electrostatic interactions including, but not limited to, Van der Waals forces, dipole-dipole interactions, ionic interactions, hydrogen bonds, or the like or any combination thereof.

As a chain of amino acids, a polypeptide expresses a unique electromagnetic field "fingerprint" that distinguishes it from other molecules. The specificity of a biomolecule's electromagnetic field also reflects the selectivity of its ligand-receptor interactions. Biomolecules are also affected by exogenous electromagnetic fields (EMFs). For example, in at least some instances, the crystalline structure of a microtubule—a ubiquitous cytoskeletal structure—can align with the cathode-anode orientation of an applied electromagnetic field.

All biomolecules (for example, proteins, RNA, DNA, or the like) can emit ELF-EM. Although the present invention is not limited to a particular theory, it is thought that the mechanism involves delocalized electrons along the biomolecule's backbone. A biomolecular ELF-EM "signature" can be driven by, for example, the nucleotide sequence of the biomolecule (or any other arrangement of subunits of the biomolecule.) Each nucleotide (or other subunit) contributes to the bulk electromagnetic field. For example, if the biomolecular structure is periodic or crystalline, the biomolecule is more likely to generate constructive interference between subunits (for example, repeating subunits.) Although the present invention is not limited to a particular theory, it is thought that these micro-amplifications of the molecule's ELF-EM field may at least partially drive intermolecular interactions, particularly those that are dependent on delocalized electrons.

Figure 8:
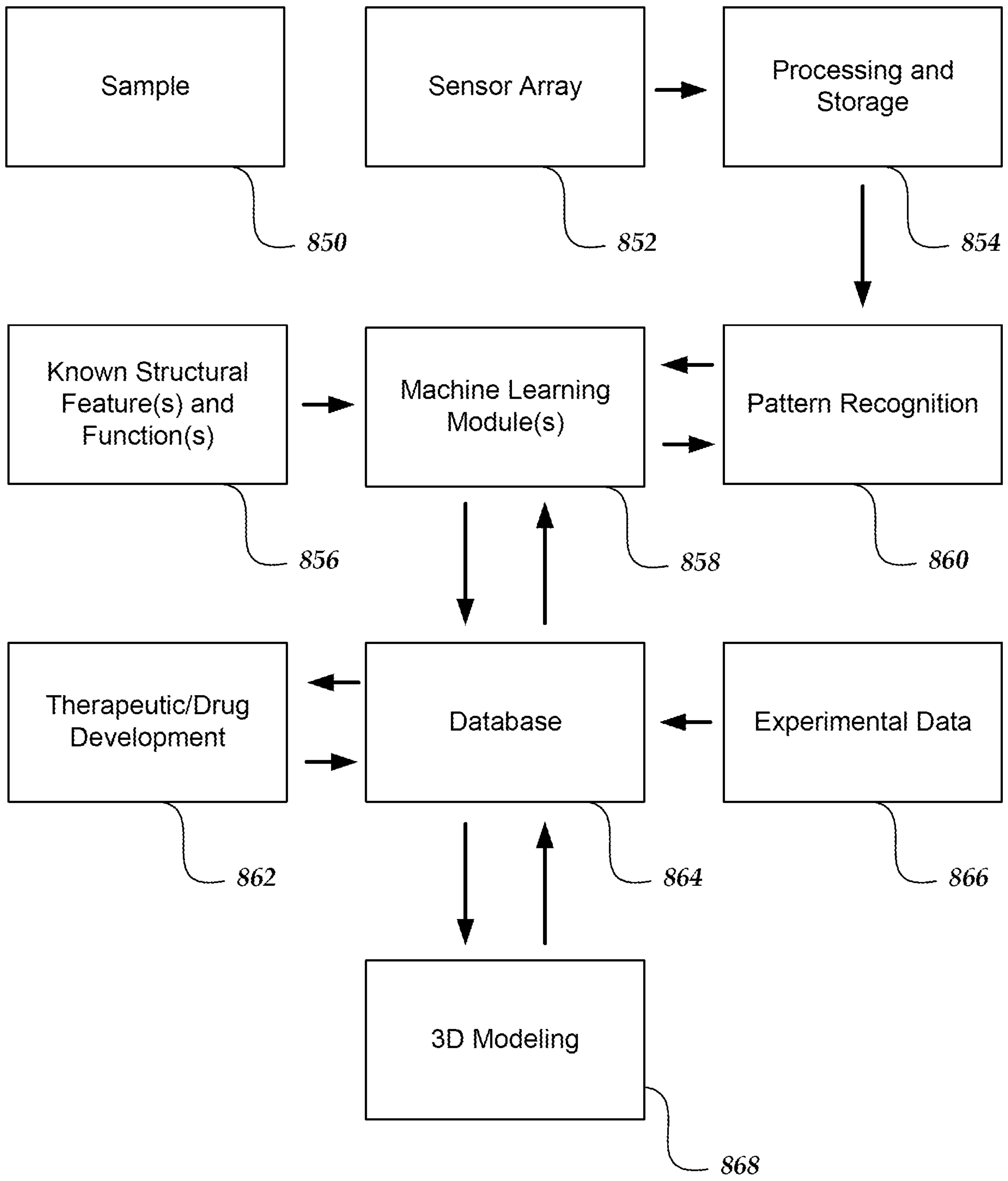
FIG. 8 is one embodiment of a block diagram for a system for identifying patterns and associated functions or structural features in molecules according to the invention.

FIG. 8 illustrates one embodiment of a system for recognizing patterns in the measured electromagnetic field of a sample compound which may be used for therapeutic or drug discovery or development. The system includes a sensor array 852 for measuring or otherwise observing an electromagnetic field of a sample 850. The sensor array can be an array of magnetoresistive (MR) sensors, SQUIDs, or OPM sensors, or the like or any combination thereof. The sensor array 852 can be a two-dimensional array, an array with sensors arranged in two or more planes, a three-dimensional array, or the like. The measured electromagnetic field is processed by one or more processors and stored in a database (processing and storage 854 in FIG. 8). The processors and database may be local to the sensor array 852 or can be remote from the sensor array.

A pattern recognition module 860 includes one or more pattern recognition or discovery algorithms to identify statistical or other pattern(s) in the measured electromagnetic field. In at least some embodiments, the pattern recognition module may utilize machine learning module(s) 858 and known structural feature(s) or function(s) of the sample 850 to associate the identified pattern(s) of the sample 850 to the sequence (where applicable), structural feature(s), and function of the sample 850.

Any suitable machine learning module(s) 858 can be used including, but not limited to, neural networks, decision trees, classifier algorithms, clustering algorithms, support vector machine algorithms, regression algorithms, nearest neighbor algorithms, or the like or any combination thereof. In at least some embodiments, the machine learning algorithm(s) 858 can be trained using known molecules; known patterns; and known structural features and functions 856. In at least some embodiments, at least one threshold criterion (or any other suitable criterion) is used to determine when an identified pattern is associated with a particular structural feature or function or with similar identified patterns for other molecules (or the same molecule). In at least some embodiments, the system can include the threshold criteria (or any other suitable criteria) or a user can set or modify the threshold criteria (or any other suitable criteria).

In at least some embodiments, the pattern recognition module 860 or machine learning module(s) 858 may also include input from one or more people to facilitate the identification of patterns or association of a pattern to a function or structural feature.

In at least some embodiments, the associations of a pattern to a function or structural feature is stored in a database 864. In at least some embodiments, the pattern recognition module 860 or machine learning module(s) 858 learn from the identified patterns and develop a set of governing rules for the patterns which may be stored in the database 864. The patterns and their association with function(s) or structural feature(s) or the governing rules for the patterns can be used for therapeutic or drug development or discovery 862 by facilitating designing of drugs or other therapeutics that will likely include desirable patterns.

In at least some embodiments, existing or new in vitro or in vivo data (for example, preclinical or clinical data) specific to one or more molecules can provide additional experimental data 866. The experimental data 866 can be stored in the database 864 and can be accessible to the machine learning module(s) 858. The machine learning module(s) 858 can access known structures, functions, patterns, 3 D mappings of the molecular magnetic field, and the experimental data 866 to facilitate drug discovery and development or other applications.

In at least some embodiments, the measured electromagnetic field and, optionally, the identified patterns and associated structural features or functions can facilitate three-dimensional modeling 868 to create a model or map of the molecule or an electrostatic potential model or map of the molecule.

The above specification provides a description of the invention and the manufacture and use of the invention. Since many embodiments of the invention can be made without departing from the spirit and scope of the invention, the invention also resides in the claims hereinafter appended.

What is claimed as new and desired to be protected is:

1. A method for identifying patterns and associated functions or structural features in molecules, the method comprising:

measuring an electromagnetic field of a target molecule disposed within a container in at least two dimensions using an array of magnetic field sensor devices disposed external to the container;

identifying at least one pattern in the measured electromagnetic field of the target molecule; and associating the at least one pattern with at least one function or structural feature of the target molecule.

2. The method of claim 1, further comprising comparing the measured electromagnetic field of the target molecule with measured electromagnetic fields of other molecules to identify at least one common pattern in the measured electromagnetic fields of the target molecule and the other molecules; and associating the at least one common pattern with at least one common function or structural feature of the target molecule and the other molecules.

3. The method of claim 1, wherein mapping the electromagnetic field comprises mapping the electromagnetic field of the target molecule in three dimensions.

4. The method of claim 1, wherein mapping the electromagnetic field comprises mapping the electromagnetic field of the target molecule in at least two different planes.

5. The method of claim 1, wherein the magnetic field sensor devices are magnetoresistive (MR) sensor devices.

6. The method of claim 1, wherein the magnetic field sensor devices are superconducting quantum interference devices (SQUIDs).

7. The method of claim 1, wherein the magnetic field sensor devices are optically pumped magnetometer (OPM) sensor devices.

8. The method of claim 1, wherein the identifying comprises identifying at least one statistical pattern in the measured electromagnetic field of the target molecule as the at least one pattern.

9. The method of claim 8, wherein the associating comprises associating the at least one statistical pattern to a sequence, structural feature, or function of the target molecule.

10. The method of claim 1, wherein measuring the electromagnetic field of the target molecule comprises solvating the target molecule in a solvent within the container;

placing the solvated target molecule, disposed within the container, in a sensor arrangement comprising the array of magnetic field sensor devices;

subjecting the solvated target molecule to a stimulus; and acquiring a magnetic field generated by the solvated target molecule in response to the stimulus.

11. A system, comprising:

a container configured for holding a target molecule within the container;

a sensor array disposed external to the container and configured for measuring or mapping an electromagnetic field generated by the target molecule;

a processing and storage arrangement configured for processing the electromagnetic field and storing the electromagnetic field after processing as a processed electromagnetic field; and a pattern recognition module configured for identifying any patterns in the processed electromagnetic field.

12. The system of claim 11, wherein the pattern recognition module is configured for identifying at least one statistical pattern in the processed electromagnetic field of the target molecule.

13. The system of claim 12, wherein the pattern recognition module is further configured for associating the at least one statistical pattern to a sequence, structural feature, or function of the target molecule.

14. The system of claim 11, wherein the pattern recognition module is configured for comparing the processed electromagnetic field of the target molecule with measured electromagnetic fields of other molecules to identify at least one common pattern in the processed electromagnetic fields of the target molecule and the other molecules and associating the at least one common pattern with at least one common function or structural feature of the target molecule and the other molecules.

15. The system of claim 14, further comprising at least one machine learning module for assisting the pattern recognition module to identify the at least one common pattern.

16. The system of claim 11, wherein the sensor array is configured for measuring or mapping the electromagnetic field of the target molecule in three dimensions.

17. The system of claim 11, wherein the sensor array is configured for measuring or mapping the electromagnetic field of the target molecule in at least two different planes.

18. The system of claim 11, wherein the sensor array comprises a plurality of magnetoresistive (MR) sensor devices.

19. The system of claim 11, wherein the sensor array comprises a plurality of superconducting quantum interference devices (SQUIDs).

20. The system of claim 11, wherein the sensor array comprises a plurality of optically pumped magnetometer (OPM) sensor devices.

* * * * *